United States Patent
Hino et al.

(10) Patent No.: US 10,475,721 B2
(45) Date of Patent: Nov. 12, 2019

(54) POWER SEMICONDUCTOR DEVICE AND METHOD FOR MANUFACTURING SAME

(71) Applicant: Mitsubishi Electric Corporation, Tokyo (JP)

(72) Inventors: Yasunari Hino, Tokyo (JP); Kiyoshi Arai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/299,315

(22) Filed: Mar. 12, 2019

(65) Prior Publication Data

US 2019/0214326 A1    Jul. 11, 2019

Related U.S. Application Data

(62) Division of application No. 15/234,524, filed on Aug. 11, 2016, now Pat. No. 10,283,430.

(30) Foreign Application Priority Data

Dec. 21, 2015    (JP) .................... 2015-248917

(51) Int. Cl.
*H01L 23/00*    (2006.01)
*H01L 23/367*    (2006.01)
(Continued)

(52) U.S. Cl.
CPC ...... *H01L 23/3675* (2013.01); *H01L 21/4875* (2013.01); *H01L 23/3735* (2013.01);
(Continued)

(58) Field of Classification Search
CPC . H01L 24/34–41; H01L 21/4871–4882; H01L 21/565; H01L 21/4875;
(Continued)

(56) References Cited

U.S. PATENT DOCUMENTS 6,255,672 B1    7/2001  Yoshioka et al.
6,459,147 B1    10/2002 Crowley et al.
(Continued)

FOREIGN PATENT DOCUMENTS

CN       103137506 A     6/2013
DE    102014008587 A1    12/2015
(Continued)

OTHER PUBLICATIONS

An Office Action mailed by the State Intellectual Property Office of the People's Republic of China dated Nov. 1, 2018, which corresponds to Chinese Patent Application No. 201611190869.2 and is related to U.S. Appl. No. 15/234,524.
(Continued)

*Primary Examiner* — Eric A. Ward
(74) *Attorney, Agent, or Firm* — Studebaker & Brackett PC

(57) ABSTRACT

In a power semiconductor device, an IGBT has a collector electrode bonded to a metal plate by a bonding material. A diode has a cathode electrode bonded to the metal plate by the bonding material. An interconnection member is bonded to an emitter electrode of the IGBT by a bonding material. The bonding material includes a bonding material and a bonding material. The bonding material is interposed between the IGBT and the interconnection member. The bonding material fills a through hole formed in the interconnection member. The bonding material reaches the bonding material and is therefore connected to the bonding material.

1 Claim, 9 Drawing Sheets

(51) Int. Cl.
| | |
|---|---|
| *H01L 21/48* | (2006.01) |
| *H01L 23/532* | (2006.01) |
| *H01L 23/528* | (2006.01) |
| *H01L 25/00* | (2006.01) |
| *H01L 25/11* | (2006.01) |
| *H01L 23/373* | (2006.01) |
| *H01L 23/433* | (2006.01) |
| *H01L 23/495* | (2006.01) |
| *H01L 21/56* | (2006.01) |
| *H01L 23/31* | (2006.01) |

(52) U.S. Cl.
CPC .... *H01L 23/4334* (2013.01); *H01L 23/49562* (2013.01); *H01L 23/5283* (2013.01); *H01L 23/53228* (2013.01); *H01L 24/31* (2013.01); *H01L 24/39* (2013.01); *H01L 25/115* (2013.01); *H01L 25/50* (2013.01); *H01L 21/565* (2013.01); *H01L 23/3107* (2013.01); *H01L 23/49548* (2013.01); *H01L 23/49575* (2013.01); *H01L 2224/40137* (2013.01); *H01L 2924/13055* (2013.01); *H01L 2924/13091* (2013.01)

(58) Field of Classification Search
CPC ............. H01L 23/3107; H01L 23/3675; H01L 23/3735; H01L 23/4334; H01L 23/49548; H01L 24/26–33; H01L 24/84; H01L 24/85; H01L 24/31; H01L 24/39; H01L 25/115; H01L 25/50; H01L 2924/13055; H01L 2924/13091; H01L 2224/40137
See application file for complete search history.

(56) References Cited

U.S. PATENT DOCUMENTS

| | | |
|---|---|---|
| 2011/0001222 A1 | 1/2011 | Nishimura et al. |
| 2012/0068357 A1 | 3/2012 | Saito et al. |
| 2013/0134210 A1 | 5/2013 | Muto et al. |
| 2013/0270326 A1 | 10/2013 | Yoon et al. |
| 2013/0307130 A1 | 11/2013 | Oga et al. |
| 2015/0008253 A1 | 1/2015 | Yoon et al. |
| 2015/0130085 A1 | 5/2015 | Hino |
| 2015/0270207 A1 | 9/2015 | Kim et al. |
| 2015/0357303 A1 | 12/2015 | Kohl et al. |

FOREIGN PATENT DOCUMENTS

| | | |
|---|---|---|
| JP | 2007-184525 A | 7/2007 |
| JP | 2008-182074 A | 8/2008 |
| JP | 2011-204886 A | 10/2011 |
| JP | 2012-178513 A | 9/2012 |
| JP | 2013-131735 A | 7/2013 |
| JP | 2013-220476 A | 10/2013 |
| JP | 2014-154696 A | 8/2014 |
| JP | 2014-199852 A | 10/2014 |
| JP | 2015-024443 A | 2/2015 |
| JP | 2015-041716 A | 3/2015 |
| JP | 2015-167193 A | 9/2015 |

OTHER PUBLICATIONS

An Office Action mailed by the Japanese Patent Office dated Dec. 11, 2018, which corresponds to Japanese Patent Application No. 2015-248917 and is related to U.S. Appl. No. 15/234,524.

An Office Action mailed by the Japanese Patent Office dated Jul. 31, 2018, which corresponds to Japanese Patent Application No. 2015-248917 and is related to U.S. Appl. No. 15/234,524.

An Office Action issued by the German Patent and Trademark Office dated Jul. 10, 2017, which corresponds to German Patent Application 10 2016 224 068.4 and is related to U.S. Appl. No. 15/234,524; with English language translation.

An Office Action issued by the Chinese Patent Office dated Jul. 9, 2019, which corresponds to Chinese Patent Application No. 201611190869.2 and is related to U.S. Appl. No. 16/299,315; with English language translation.

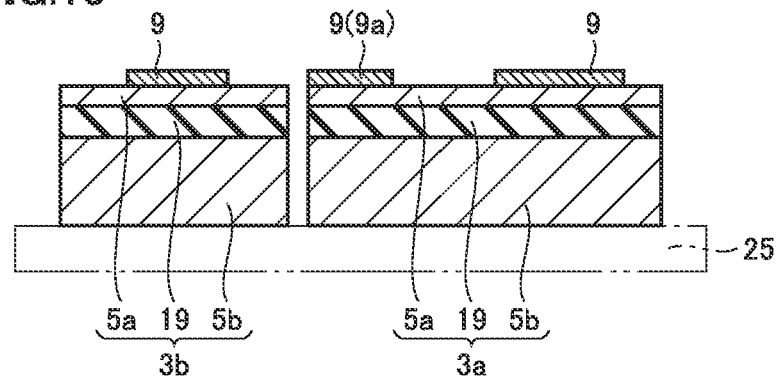
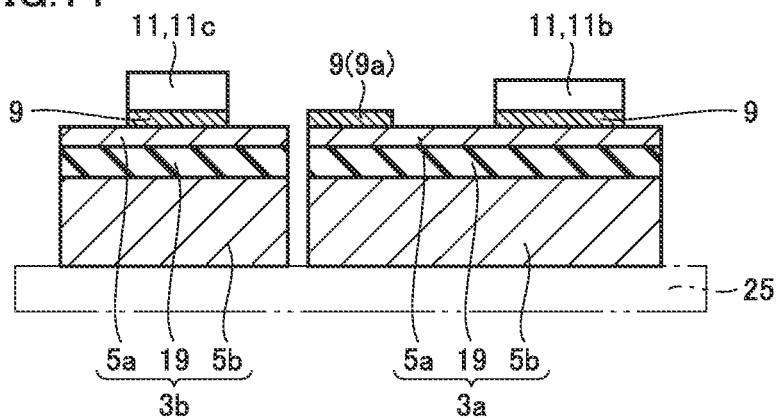

POWER SEMICONDUCTOR DEVICE AND METHOD FOR MANUFACTURING SAME

CROSS-REFERENCE TO RELATED APPLICATION

This application is a divisional of U.S. patent application Ser. No. 15/234,524 filed Aug. 11, 2016, and claims priority to Japanese Patent Application No. 2015-248917 filed Dec. 21, 2015, the disclosure of which is incorporated by reference herein.

BACKGROUND OF THE INVENTION

Field of the Invention

The present invention relates to a power semiconductor device and a method for manufacturing the power semiconductor device, particularly, a power semiconductor device used for control of power and a method for manufacturing the power semiconductor device.

Description of the Background Art

Power semiconductor devices have been used for industrial devices, driving control devices for household appliances including motors, in-vehicle control devices for electric vehicles and hybrid vehicles, railway control devices, control devices for photovoltaic power generation, and the like. Accordingly, power semiconductor devices are required to handle high power. Such power semiconductor devices are disclosed in, for example, Patent Document 1 (Japanese Patent Laying-Open No. 2015-024443), Patent Document 2 (Japanese Patent Laying-Open No. 2012-178513) and Patent Document 3 (Japanese Patent Laying-Open No. 2013-220476).

In recent years, in response to increased environmental regulation, power semiconductor devices are required to achieve higher efficiency and more energy saving in consideration of environmental issues. Particularly, in in-vehicle control devices or railway control devices, in order to achieve energy saving and suppress loss involved in conversion of electrical energy, power semiconductor devices have begun to be used under a high-load environment (under a high-temperature environment) (increased Tj).

Accordingly, the power semiconductor devices are required to suppress the loss and operate with high efficiency even under the high-temperature environment. Specifically, a general operation temperature of a conventional power semiconductor device is Tj=125° C. or less or Tj=150° C. or less; however, in future, it is expected to operate a power semiconductor device under a high-temperature environment of Tj=175° C. or more or Tj=200° C. or more.

SUMMARY OF THE INVENTION

In order to operate such a power semiconductor device (semiconductor module) under a high-temperature environment, a review on material and structure of the power semiconductor device is considered. Particularly, it is required to achieve high bonding strength between a semiconductor element and an interconnection member or the like in the power semiconductor device under the high-temperature environment. A power semiconductor device including a semiconductor element and an interconnection member or the like bonded to each other by a Sn-based solder has a problem in durability of the bonding portion between the semiconductor element and the interconnection member or the like under a high-temperature environment.

The present invention has been made as part of such development, has an object to provide a power semiconductor device to improve bonding strength between a semiconductor element and an interconnection member or the like, and has another object to provide a method for manufacturing such a power semiconductor device.

A power semiconductor device according to the present invention includes a semiconductor element, a conductor portion, a heat dissipation plate, and a sealing material. The semiconductor element includes a first power element having a first surface and a second surface opposite to each other. The heat dissipation plate includes a first conductor plate bonded to the first surface of the first power element. The conductor portion includes a first interconnection member that is bonded to the second surface of the first power element and that is electrically connected to the first power element. The bonding material includes a first bonding material for bonding the first surface of the first power element to the first conductor plate, and a second bonding material for bonding the second surface of the first power element to the first interconnection member. The sealing material seals the semiconductor element, the conductor portion, and the heat dissipation plate. The bonding material includes an intermetallic compound. The second bonding material includes a first portion and a second portion. The first portion is interposed between the second surface of the first power element and the first interconnection member. The second portion is connected to the first portion through the first interconnection member.

A method for manufacturing a power semiconductor device according to the present invention includes the following steps. A heat dissipation plate including a first conductor plate is prepared. A first bonding material is applied to the first conductor plate. A semiconductor element is placed on the first bonding material. A first portion of the second bonding material is applied to the semiconductor element. A first interconnection member in which a through hole is formed is prepared. The first interconnection member is placed on the first portion of the second bonding material and the first interconnection member is held such that the first portion of the second bonding material is exposed through the through hole. A second portion of the second bonding material is applied to the through hole to fill the through hole such that the second portion of the second bonding material reaches the first portion of the second bonding material. A heat treatment is performed to the first bonding material, the first portion of the second bonding material, and the second portion of the second bonding material. The semiconductor element, the heat dissipation plate, and the first interconnection member are disposed in a mold. The semiconductor element, the heat dissipation plate, and the first interconnection member are sealed by filling the mold with a sealing material. The semiconductor element, the heat dissipation plate, and the first interconnection member each sealed by the sealing material are removed from the mold. In the steps of applying the first bonding material, the first portion of the second bonding material, and the second portion of the second bonding material, a material including particles of tin (Sn) and particles of at least one metal selected from a group consisting of copper (Cu), nickel (Ni), and silver (Ag) is used. In the step of performing the heat treatment, an intermetallic compound of the one metal and the tin (Sn) is formed.

In accordance with the power semiconductor device according to the present invention, the intermetallic compound is included in the bonding material including (i) the first bonding material for bonding the first power element to the first conductor plate and (ii) the second bonding material for bonding the first power element to the first interconnection member. Moreover, the second bonding material includes: the first portion interposed between the second surface of the first power element and the first interconnection member; and the second portion connected to the first portion through the first interconnection member. Accordingly, bonding strength between the first power element and the heat dissipation plate can be improved and bonding strength between the first power element and the first interconnection member can be improved.

In accordance with the method for manufacturing the power semiconductor device according to the present invention, the intermetallic compound is formed by performing the heat treatment to (i) the first bonding material for bonding the first power element to the first conductor plate and (ii) the first and second portions of the second bonding material for bonding the first power element to the first interconnection member. Accordingly, there can be manufactured a power semiconductor device having improved bonding strength between the first power element and the heat dissipation plate and improved bonding strength between the first power element and the first interconnection member.

The foregoing and other objects, features, aspects and advantages of the present invention will become more apparent from the following detailed description of the present invention when taken in conbonding with the accompanying drawings.

BRIEF DESCRIPTION OF THE DRAWINGS

FIG. 13 is a cross sectional view showing a step performed after the step shown in FIG. 12 in the embodiment.

FIG. 14 is a cross sectional view showing a step performed after the step shown in FIG. 13 in the embodiment.

DESCRIPTION OF THE PREFERRED EMBODIMENTS

First Embodiment

Figure 1:
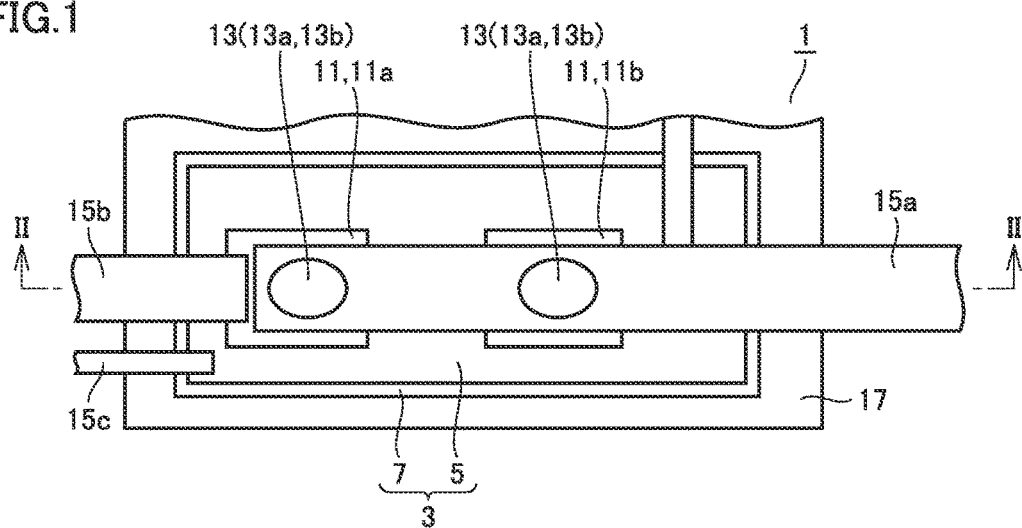
FIG. 1 is a partial plan view of a power semiconductor device according to a first embodiment.
Figure 2:
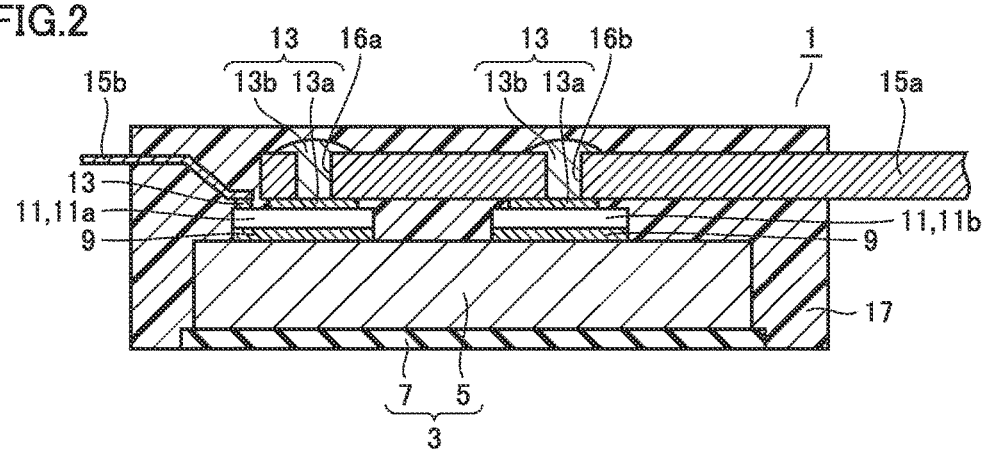
FIG. 2 is a cross sectional view along a cross sectional line II-II shown in FIG. 1 in the embodiment.

The following describes a power semiconductor device according to a first embodiment. As shown in FIG. 1 and FIG. 2, in a power semiconductor device 1, semiconductor elements 11 are mounted on a heat dissipation plate 3. An interconnection member 15a and an interconnection member 15b are connected to semiconductor elements 11. Semiconductor elements 11, heat dissipation plate 3, and interconnection members 15a, 15b are sealed by a molding resin 17.

The structure of power semiconductor device 1 will be described more in detail. Here, an IGBT (Insulated Gate Bipolar Transistor) 11a and a diode 11b are shown as exemplary semiconductor elements 11. Each of IGBT 11a and diode 11b is composed of a quadrangle of silicon (Si) or silicon carbide (SiC) having sides having lengths of about 7 mm to 15 mm, for example.

Electrodes are formed on front surfaces and backside surfaces of IGBT 11a and diode 11b. The electrodes are composed of aluminum (Al) or aluminum silicon (AlSi). On a surface of each of the electrodes, a titanium nickel gold (Ti—Ni—Au) film is formed as a coating layer.

A collector electrode (not shown) is formed on the backside surface of IGBT 11a. A gate electrode and an emitter electrode (both not shown) are formed on the front surface of IGBT 11a. An anode electrode (not shown) is formed on the backside surface of diode 11b. A cathode electrode (not shown) is formed on the front surface of diode 11b.

Heat dissipation plate 3 includes a metal plate 5 and an insulating metal layer 7. Metal plate 5 has a relatively high thermal conductivity such as about 400 W/m·k. Metal plate 5 has a relatively low electrical resistivity such as about 2 $\mu\Omega$·cm. Metal plate 5 is composed of a metal such as copper or a copper alloy, for example. Metal plate 5 has a thickness of about 3 mm to 5 mm, for example.

Insulating metal layer 7 is adhered to the backside surface of metal plate 5. Insulating metal layer 7 is configured to have a layer structure including an insulating layer and a protective metal layer. As the insulating layer, an epoxy resin having a filler, such as boron nitride and alumina, introduced therein is applied, for example. As the protective metal layer, a metal layer having a relatively high thermal conductivity, such as copper or aluminum, is applied. The insulating layer and the protective metal layer are adhered to each other.

The collector electrode of IGBT 11a is bonded to metal plate 5 by a bonding material 9. The cathode electrode of diode 11b is bonded to metal plate 5 by bonding material 9. The collector electrode of IGBT 11a is electrically connected to the cathode electrode of diode 11b via conductive bonding material 9 and metal plate 5.

Interconnection member 15a is bonded to the emitter electrode of IGBT 11a by a bonding material 13. Bonding material 13 includes a bonding material 13a and a bonding material 13b. Bonding material 13a is interposed between IGBT 11a and interconnection member 15a. Bonding material 13b fills a through hole 16a formed in interconnection member 15a. Bonding material 13b reaches bonding material 13a and is therefore connected to bonding material 13a.

Moreover, interconnection member 15b is bonded to the gate electrode of IGBT 11a by bonding material 13.

Furthermore, interconnection member 15a is bonded to the anode electrode of diode 11b by bonding material 13. Bonding material 13 includes bonding material 13a and bonding material 13b. Bonding material 13a is interposed between diode 11b and interconnection member 15a. Bonding material 13b fills a through hole 16b formed in interconnection member 15a. Bonding material 13b reaches bonding material 13a and is therefore connected to bonding material 13a. The emitter electrode of IGBT 11a is electrically connected to the anode electrode of diode 11b via conductive bonding material 13 and interconnection member 15a.

Moreover, an interconnection member 15c is bonded to metal plate 5 by a conductive bonding material (not shown). Interconnection member 15a, interconnection member 15b, and interconnection member 15c are projected from molding resin 17, and are electrically connected to an external device (not shown), for example. IGBT 11a and diode 11b are controlled to be on and off in response to a signal from outside.

Each of conductive bonding materials 9, 13 is provided with a function as a bonding material by providing a heat treatment (low-temperature sintering) to a paste-state material including metal particles. In the heat treatment, low-temperature sintering is performed using the bonding material's lowered melting point provided by the nano size of the metal particles. Examples of the metal particles applied herein include metal particles in combination with tin (Sn) particles and particles of at least one metal selected from a group consisting of copper (Cu), nickel (Ni), and silver (Ag).

The metal particles have sizes of about several tens nm to several ten μm, for example. As a result of the low-temperature sintering, an intermetallic compound of these metals is formed. The intermetallic compound thus formed provides sufficient bonding strength. Moreover, each of bonding materials 9, 13 is provided with a high melting point, thereby securing a high thermal resistance. The thickness of each of bonding materials 9, 13 having been through the low-temperature sintering is about 50 μm, for example.

Figure 3:
FIG. 3 is a cross sectional view showing one step of a method for manufacturing the power semiconductor device in the embodiment.
Figure 4:
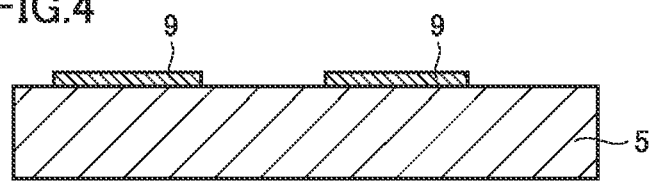
FIG. 4 is a cross sectional view showing a step performed after the step shown in FIG. 3 in the embodiment.

Next, the following describes an exemplary method for manufacturing power semiconductor device 1 described above. First, as shown in FIG. 3, metal plate 5 having a predetermined size and composed of a metal such as copper or a copper alloy is prepared. Next, as shown in FIG. 4, for example, screen printing or the like is employed to apply bonding material 9 to metal plate 5 at its regions on which the semiconductor elements are to be mounted. Before the low-temperature sintering, this bonding material 9 is a paste-state bonding material including the metal particles.

Figure 5:
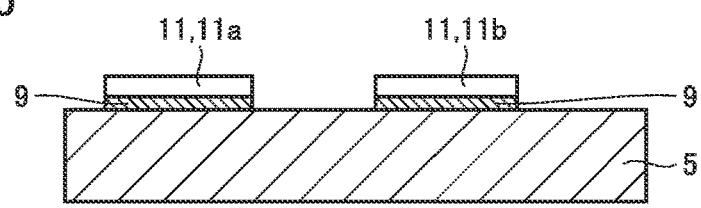
FIG. 5 is a cross sectional view showing a step performed after the step shown in FIG. 4 in the embodiment.
Figure 6:
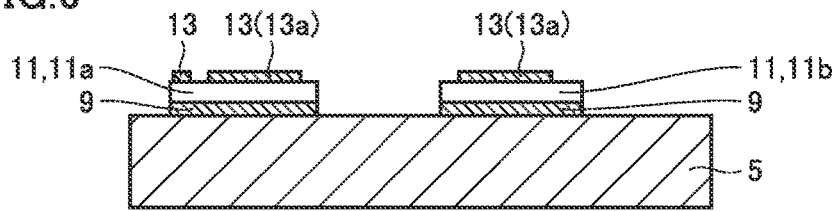
FIG. 6 is a cross sectional view showing a step performed after the step shown in FIG. 5 in the embodiment.

Next, as shown in FIG. 5, semiconductor elements 11 (IGBT 11a, diode 11b) are placed on paste-state bonding material 9. Next, for example, as shown in FIG. 6, screen printing or the like is employed to apply bonding material 13 (13a) to semiconductor elements 11 at their regions to which the interconnection members are to be bonded. Before the low-temperature sintering, this bonding material 13 is also a paste-state bonding material including the metal particles.

Figure 7:
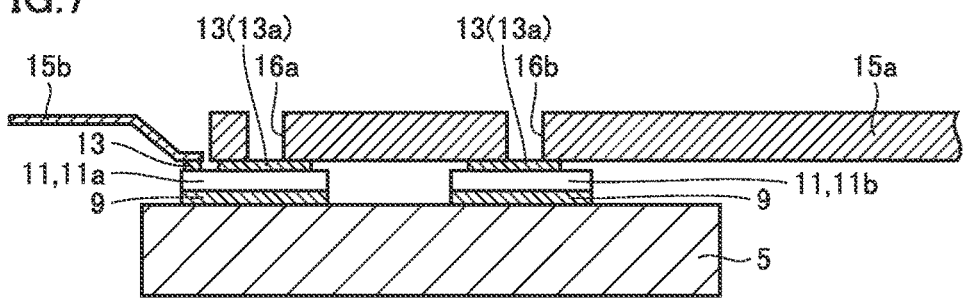
FIG. 7 is a cross sectional view showing a step performed after the step shown in FIG. 6 in the embodiment.

Next, interconnection member 15a, interconnection member 15b, and the like are prepared (see FIG. 7). Interconnection member 15a is provided with through holes 16a, 16b. Next, as shown in FIG. 7, interconnection member 15a, interconnection member 15b, and the like are placed on bonding material 13 and held by a fixture (not shown). On this occasion, a pressure of, for example, not more than 1 MPa is applied to push out a solvent, which would have otherwise caused generation of voids, from paste-state bonding materials 9, 13.

Figure 8:
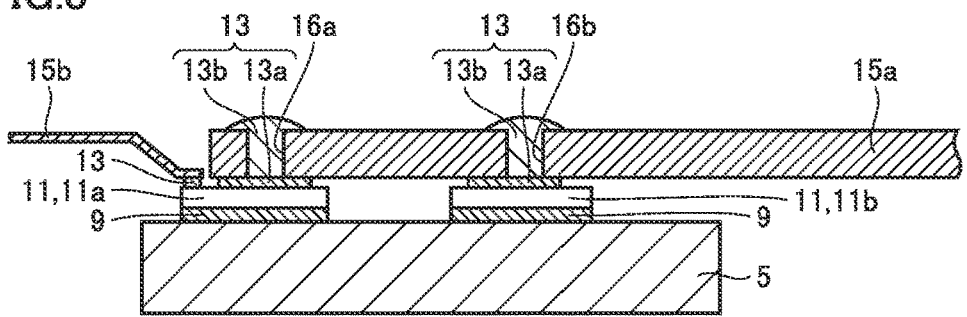
FIG. 8 is a cross sectional view showing a step performed after the step shown in FIG. 7 in the embodiment.

Next, as shown in FIG. 8, through holes 16a, 16b of interconnection member 15a are filled with bonding material 13 (13b). Next, a heat treatment (low-temperature sintering) is performed under a temperature of about 200° C. to 300° C., for example (liquid phase diffusion bonding). By performing the heat treatment, the intermetallic compound is formed by the metal particles included therein. Each of bonding materials 9, 13 having been through the heat treatment has a heat-resistant temperature of about 500° C. to 900° C.

Figure 9:
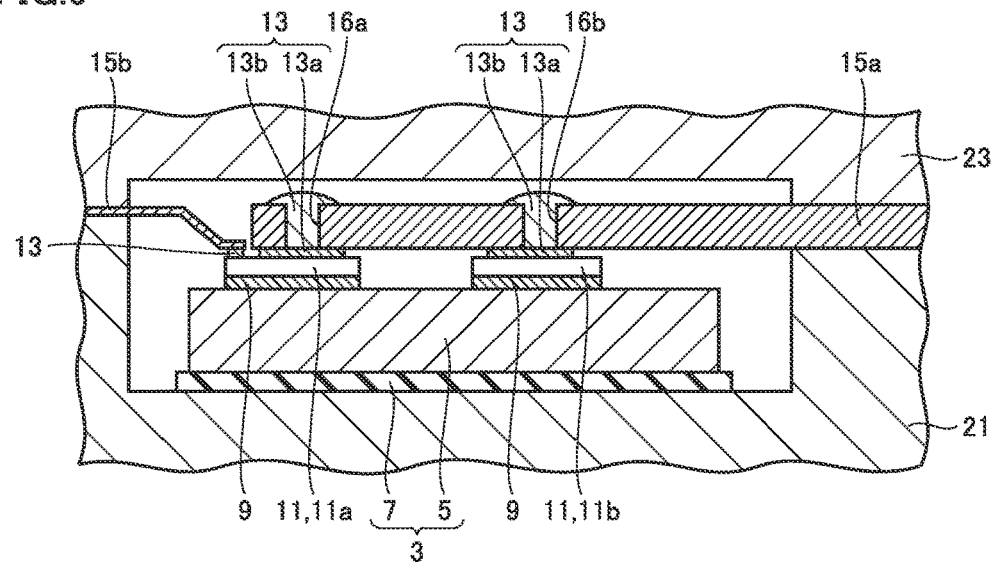
FIG. 9 is a cross sectional view showing a step performed after the step shown in FIG. 8 in the embodiment.

Next, as shown in FIG. 9, metal plate 5, on which semiconductor elements 11 are bonded to interconnection member 15a and the like, and insulating metal layer 7 are disposed in a cavity of a lower mold 21. Next, an upper mold 23 is disposed thereon, thereby sandwiching interconnection members 15a, 15b between lower mold 21 and upper mold 23. Next, a resin (not shown) is introduced into the cavity of lower mold 21 and upper mold 23. A main component of the resin is an epoxy resin. Metal plate 5, semiconductor elements 11, interconnection member 15a, and the like are sealed by molding resin 17 (see FIG. 2). Moreover, molding resin 17 allows insulating metal layer 7 to be in intimate contact with metal plate 5.

Then, lower mold 21 and upper mold 23 are removed, thus completing power semiconductor device 1 sealed by molding resin 17 as shown in FIG. 2.

In the power semiconductor device described above, semiconductor element 11 is bonded to other members (metal plate 5, interconnection member 15a, and the like) by bonding materials 9, 13 both including the intermetallic compound, thereby securing strong bonding strength. Now, this will be described below.

Generally, electric connection from the front surface of the semiconductor element, for example, to an external electrode or the like is attained using a metal wire such as aluminum as an interconnection member, and the metal wire is bonded to the front surface of the semiconductor element in a solid state by way of wire bonding. In a power semiconductor device among semiconductor devices, switching control is performed with respect to a large amount of current and the large amount of current flows as an operation current. Hence, in the power semiconductor device, a plurality of metal wires are connected in parallel. Moreover, as each of the metal wires, a relatively thick metal wire having a wire diameter of about 500 μm is used.

However, in such a technique, there are limitations in terms of electric capacitance and life of bonding portion. As the power semiconductor device is decreased in size, the semiconductor element is also decreased in size. This makes it difficult to increase the number of metal wires to be connected in parallel. Moreover, if each metal wire is configured to have a thick wire diameter, it is necessary to apply pressure onto the metal wire to increase vibrating force when bonding the metal wire to the front surface of the semiconductor element. If this force becomes too strong on this occasion, the semiconductor element (semiconductor chip) may be broken.

Furthermore, in the power semiconductor device, interconnection heat cycle and power cycle are caused due to an operation of the power semiconductor device. Hence, the power semiconductor device needs to withstand such a severe environment. Moreover, there is a tendency toward increased specification output of the power semiconductor device, and the power semiconductor device is required to achieve, for example, an output of several hundreds volts, furthermore, an output of several thousands volts. Hence, a bonding portion of an interconnection is required to permit flow of a large amount of current therein and achieve a low electric resistance. Furthermore, even under such a severe environment, it is required to achieve improved reliability and longer life of the bonding portion.

In the power semiconductor device described above, semiconductor elements 11 are bonded to metal plate 5 by bonding material 9. Semiconductor elements 11 are bonded to interconnection member 15a and the like by bonding material 13. In each of bonding materials 9, 13, the intermetallic compound is formed through the low-temperature sintering of the paste-state bonding material including the predetermined metal particles. That is, there is formed the intermetallic compound of tin (Sn) and at least one metal selected from a group consisting of copper (Cu), nickel (Ni), and silver (Ag). More specifically, there are the following seven types of intermetallic compounds: (Sn+Cu), (Sn+Ni), (Sn+Ag), (Sn+Cu+Ni), (Sn+Cu+Ag), (Sn+Ni+Ag), and (Sn+Cu+Ni+Ag).

In this way, bonding strength between each semiconductor element 11 and metal plate 5 can be improved and bonding strength between semiconductor element 11 and interconnection member 15a or the like can be improved. Particularly, at semiconductor element 11 and interconnection member 15a, bonding material 13b filling through holes 16a, 16b formed in interconnection member 15a is connected to bonding material 13a. Accordingly, semiconductor elements 11 can be bonded to interconnection member 15a and the like more strongly.

Moreover, because the intermetallic compound is formed, each of bonding materials 9, 13 has a heat-resistant temperature of about 500° C. to 900° C. after the low-temperature sintering (about 200° C. to 300° C.) of the paste-state bonding material. Accordingly, even when the power semiconductor device is used under a high-temperature environment, the bonding strengths of bonding materials 9, 13 can be sufficiently secured.

Furthermore, since each of interconnection member 15a and the like is composed of copper or a copper alloy, electrical resistivity can be suppressed to a relatively low value. Furthermore, heat generated in semiconductor element 11 can be dissipated from not only heat dissipation plate 3 but also interconnection member 15a and the like.

Second Embodiment

Figure 10:
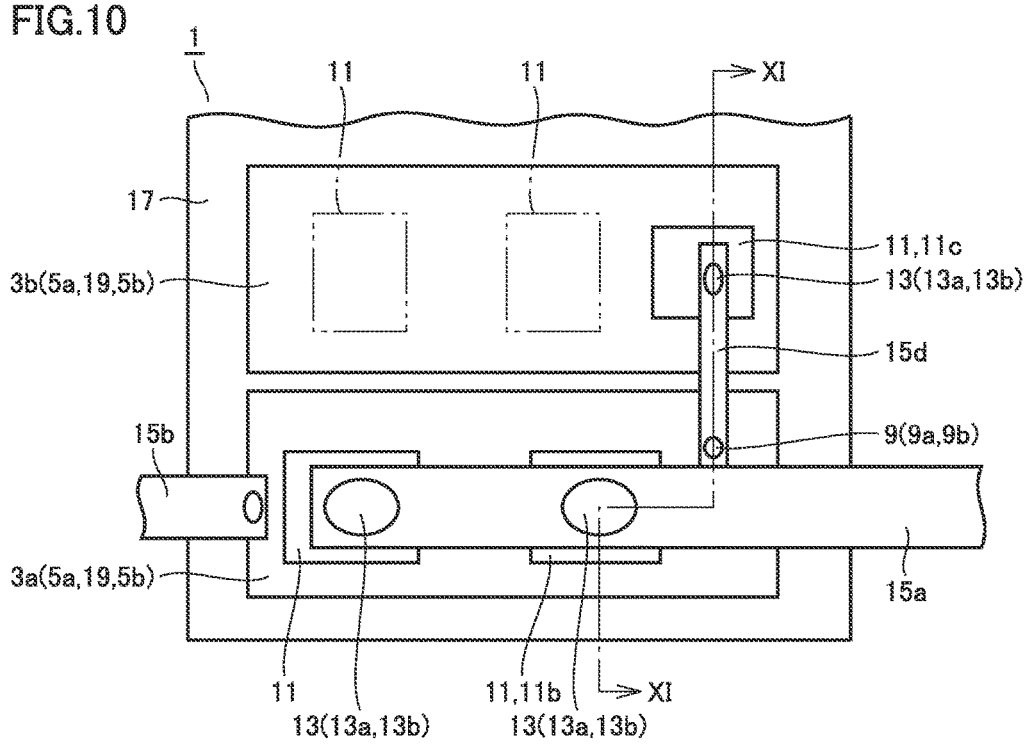
FIG. 10 is a partial plan view of a power semiconductor device according to a second embodiment.
Figure 11:
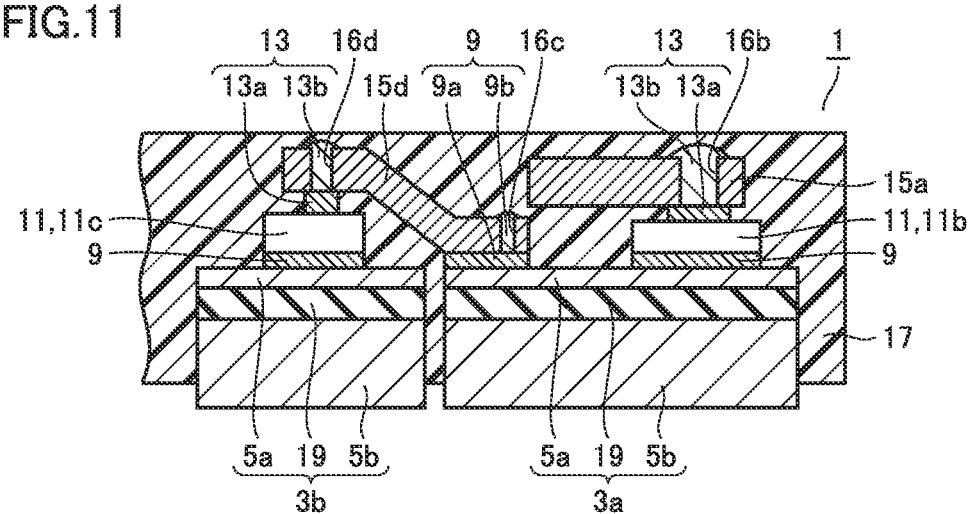
FIG. 11 is a cross sectional view along a cross sectional line XI-XI shown in FIG. 10 in the embodiment.

The following describes a power semiconductor device according to a second embodiment. As shown in FIG. 10 and FIG. 11, in power semiconductor device 1, at least two heat dissipation plates 3a, 3b are disposed with a distance interposed therebetween. Each of heat dissipation plate 3a and heat dissipation plate 3b includes a metal plate 5a, an insulating substrate 19, and a metal plate 5b. Insulating substrate 19 is interposed between metal plate 5a and metal plate 5b.

Insulating substrate 19 is composed of an epoxy resin, silicon nitride, aluminum nitride, alumina, or the like, for example. Moreover, insulating substrate 19 has a constant thickness of about 0.2 mm to 3 mm Configurations other than this are the same as those of the power semiconductor device shown in FIG. 1 and FIG. 2, so that the same members are given the same reference characters and are not repeatedly described in detail unless necessary.

Semiconductor element 11 including diode 11b is mounted on heat dissipation plate 3a. The cathode electrode (not shown) of diode 11b is bonded to metal plate 5a by bonding material 9. Interconnection member 15a is bonded to the anode electrode (not shown) of diode 11b by bonding material 13. Bonding material 13 includes bonding material 13a and bonding material 13b. Bonding material 13a is interposed between diode 11b and interconnection member 15a. Bonding material 13b fills a through hole 16b formed in interconnection member 15a. Bonding material 13b reaches bonding material 13a and is therefore connected to bonding material 13a.

Moreover, the electrode (not shown) of semiconductor element 11 is bonded to metal plate 5a by a bonding material (not shown). Interconnection member 15a is bonded to the electrode (not shown) of semiconductor element 11 by bonding material 13.

Semiconductor element 11 including diode 11c is mounted on heat dissipation plate 3b. The cathode electrode (not shown) of diode 11c is bonded to metal plate 5a by bonding material 9. Interconnection member 15d has one end bonded to the anode electrode (not shown) of diode 11c by bonding material 13. Bonding material 13 includes bonding material 13a and bonding material 13b. Bonding material 13a is interposed between diode 11c and interconnection member 15d. Bonding material 13b fills a through hole 16d formed in interconnection member 15d. Bonding material 13b reaches bonding material 13a and is therefore connected to bonding material 13a.

Interconnection member 15d has the other end bonded to metal plate 5a of heat dissipation plate 3a by bonding material 9. Bonding material 9 includes bonding material 9a and bonding material 9b. Bonding material 9a is interposed between metal plate 5a and interconnection member 15d. Bonding material 9b fills a through hole 16c formed in interconnection member 15d. Bonding material 9b reaches bonding material 9a and is therefore connected to bonding material 9a. Diode 11b, diode 11c, and the like are electrically connected to one another via bonding material 9, interconnection member 15d, and bonding material 13.

Figure 12:
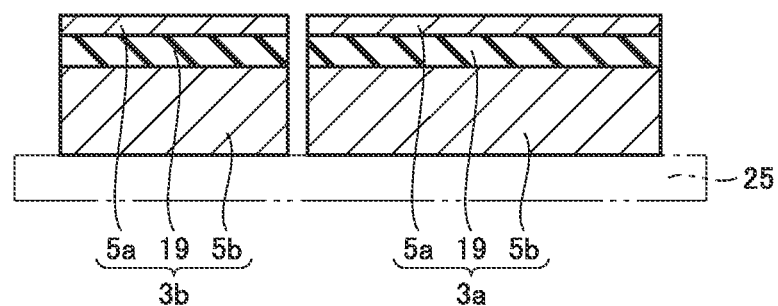
FIG. 12 is a cross sectional view showing one step of a method for manufacturing the power semiconductor device in the embodiment.

Next, the following describes an exemplary method for manufacturing power semiconductor device 1 described above. First, heat dissipation plate 3a and heat dissipation plate 3b (see FIG. 12) are prepared. Next, as shown in FIG. 12, heat dissipation plate 3a and heat dissipation plate 3b are placed in a positioning fixture 25. Positioning fixture 25 keeps a space between heat dissipation plate 3a and heat dissipation plate 3b.

Next, as shown in FIG. 13, for example, screen printing or the like is employed to apply bonding material 9 to respective metal plates 5a of heat dissipation plate 3a and heat dissipation plate 3b at their regions on which the semiconductor elements are to be mounted. Next, as shown in FIG. 14, semiconductor elements 11 (diodes 11b, 11c, and the like) are placed on paste-state bonding material 9.

Figure 15:
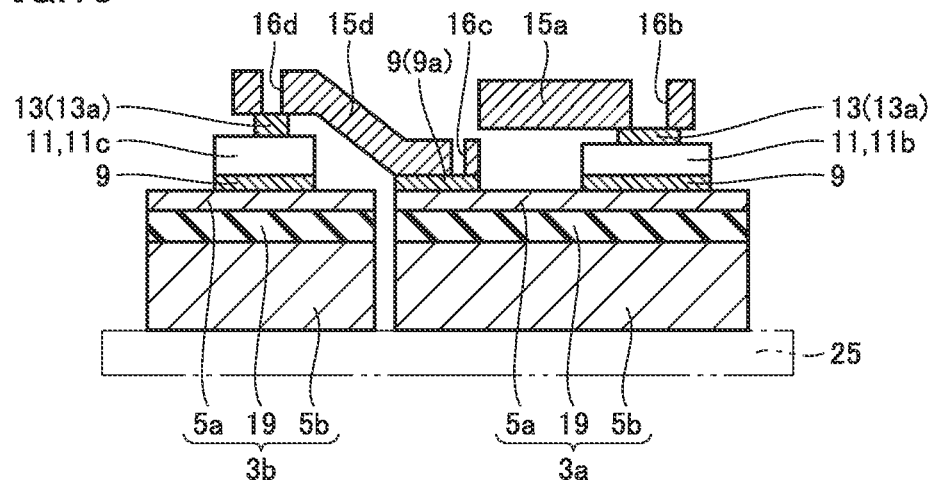
FIG. 15 is a cross sectional view showing a step performed after the step shown in FIG. 14 in the embodiment.

Next, as shown in FIG. 15, for example, screen printing or the like is employed to apply bonding material 13 (13a) to semiconductor elements 11 at their regions to which the interconnection members are to be bonded. Next, interconnection member 15a, interconnection member 15d, and the like are prepared. Interconnection member 15a is provided with through hole 16b. Interconnection member 15d is provided with through hole 16c and through hole 16d. Next, interconnection member 15a, interconnection member 15d, and the like are placed on bonding material 13, and are held by a fixture (not shown).

Figure 16:
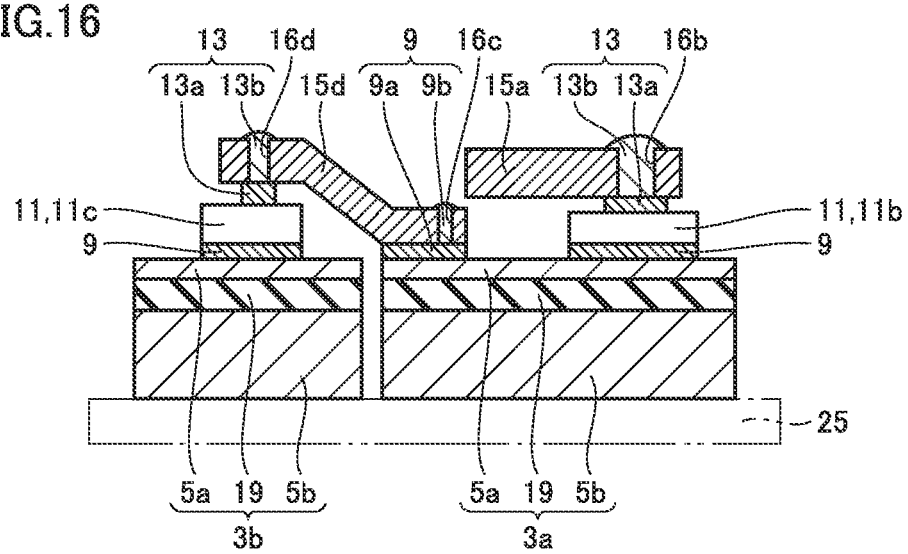
FIG. 16 is a cross sectional view showing a step performed after the step shown in FIG. 15 in the embodiment.

Next, as shown in FIG. 16, through hole 16b of interconnection member 15a is filled with bonding material 13 (13b) and through holes 16c, 16d of interconnection member 15d are filled with bonding material 13. Next, a heat treatment (low-temperature sintering) is performed under a temperature of about 200° C. to 300° C., for example (liquid phase diffusion bonding). By performing the heat treatment, the intermetallic compound is formed by the metal particles included therein. Each of bonding materials 9, 13 having been through the heat treatment has a heat-resistant temperature of about 500° C. to 900° C.

Figure 17:
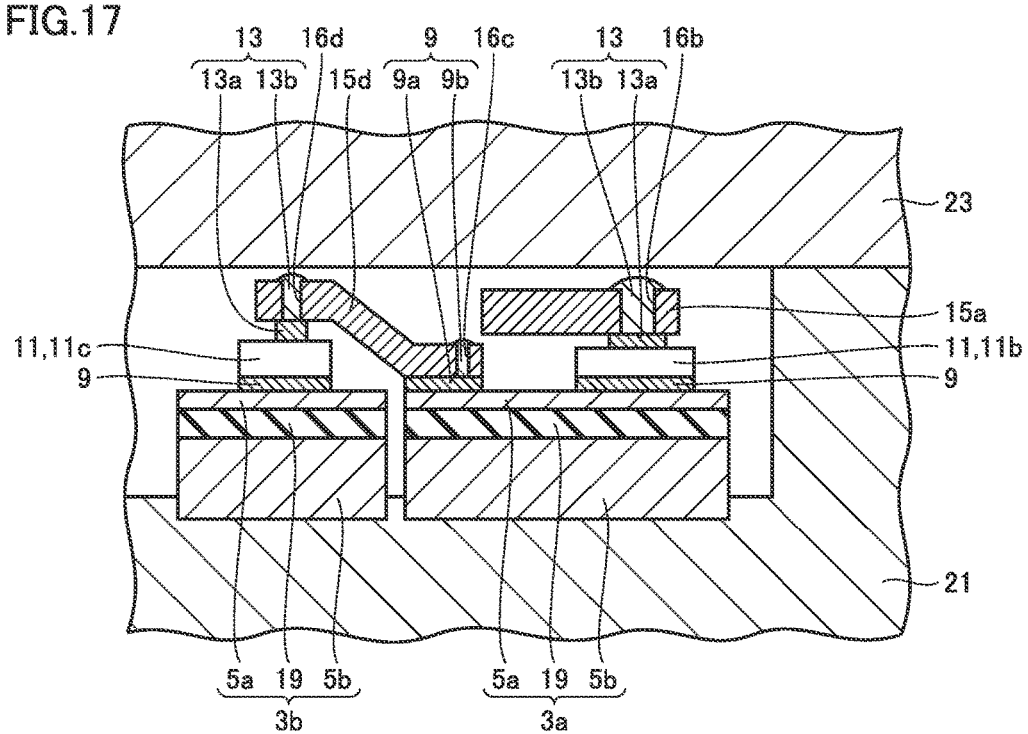
FIG. 17 is a cross sectional view showing a step performed after the step shown in FIG. 16 in the embodiment.

Next, as shown in FIG. 17, heat dissipation plates 3a, 3b on which semiconductor elements 11 are bonded to interconnection member 15a and the like are disposed in the cavity of lower mold 21. Next, upper mold 23 is disposed thereon to sandwich them between lower mold 21 and upper mold 23. Next, a resin (not shown) is introduced into the cavity of lower mold 21 and upper mold 23. Heat dissipation plates 3a, 3b, semiconductor elements 11, interconnection members 15a, 15d, and the like are sealed by molding resin 17 (see FIG. 11). Then, lower mold 21 and upper mold 23 are removed, thus completing power semiconductor device 1 sealed by molding resin 17 as shown in FIG. 11.

In the power semiconductor device described above, semiconductor elements 11 are bonded to metal plates 5a by bonding material 9. Semiconductor elements 11 are bonded to interconnection members 15a, 15d, and the like by bonding material 13. As described above, by low-temperature sintering of the paste-state bonding material including the predetermined metal particles, the intermetallic compound of Tin (Sn) and at least one metal selected from a group consisting of copper (Cu), nickel (Ni), and silver (Ag) is formed in each of bonding materials 9, 13.

Accordingly, the bonding strength between semiconductor element 11 and metal plate 5a and the bonding strength between interconnection member 15d and metal plate 5a can be improved while the bonding strength between semiconductor element 11 and interconnection member 15a, 15d, or the like can be improved.

Particularly, at interconnection member 15d and metal plate 5a, bonding material 13b filling through hole 16c formed in interconnection member 15d is connected to bonding material 13a. Accordingly, interconnection member 15d can be bonded to metal plate 5a more strongly.

Moreover, at semiconductor element 11 and interconnection member 15d, bonding material 13b filling through hole 16d formed in interconnection member 15d is connected to bonding material 13a. Accordingly, semiconductor element 11 can be bonded to interconnection member 15d more strongly.

Further, at semiconductor element 11 and interconnection member 15a, bonding material 13b filling through hole 16b formed in interconnection member 15a is connected to bonding material 13a. Accordingly, semiconductor element 11 can be bonded to interconnection member 15a more strongly. It should be noted that interconnection members 15a to 15d and metal plates 5, 5a, 5b have been illustrated as examples; however, in addition to these, a conductor portion electrically connected to the semiconductor element can be bonded using a bonding material.

Moreover, as described above, since the intermetallic compound is formed in each of bonding materials 9, 13, each of bonding materials 9, 13 has a heat-resistant temperature of about 500° C. to 900° C. Accordingly, even when the power semiconductor device is used under a high-temperature environment, the bonding strengths of bonding materials 9, 13 can be sufficiently secured. It should be noted that the metal for forming the intermetallic compound is not limited to the metal described above.

Furthermore, since interconnection member 15a and the like are composed of copper or a copper alloy, electrical resistivity can be suppressed to a relatively low value. Moreover, heat generated in semiconductor element 11 can be dissipated from not only heat dissipation plate 3 but also interconnection member 15a and the like. In order to achieve more efficient heat dissipation, a plurality of fins may be attached to heat dissipation plate 3.

As semiconductor elements 11, IGBT 11a and diodes 11b, 11c are illustrated as examples; however, a MOSFET (Metal Oxide Semiconductor Field Effect Transistor) may be included. Moreover, these semiconductor elements 11 may be composed of silicon (Si), silicon carbide (SiC), or gallium nitride (GaN).

It should be noted that power semiconductor devices 1 described in the respective embodiments may be combined variously as required.

The present invention is used effectively in a power semiconductor device used for control of power.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a power semiconductor device, comprising the steps of:

preparing a heat dissipation plate including a first conductor plate;

applying a first bonding material to the first conductor plate;

placing a semiconductor element on the first bonding material;

applying a first portion of the second bonding material to the semiconductor element;

preparing a first interconnection member in which a through hole is formed;

placing the first interconnection member on the first portion of the second bonding material and holding the first interconnection member such that the first portion of the second bonding material is exposed through the through hole;

applying a second portion of the second bonding material to the through hole to fill the through hole such that the second portion of the second bonding material reaches the first portion of the second bonding material;

performing a heat treatment to the first bonding material, the first portion of the second bonding material, and the second portion of the second bonding material;

disposing the semiconductor element, the heat dissipation plate, and the first interconnection member in a mold;

sealing the semiconductor element, the heat dissipation plate, and the first interconnection member by filling the mold with a sealing material; and removing, from the mold, the semiconductor element, the heat dissipation plate, and the first interconnection member each sealed by the sealing material, in the steps of applying the first bonding material, the first portion of the second bonding material, and the second portion of the second bonding material, a material including particles of tin (Sn) and particles of at least one metal selected from a group consisting of copper (Cu), nickel (Ni), and silver (Ag) being used, in the step of performing the heat treatment, an intermetallic compound of the one metal and the tin (Sn) being formed.

* * * * *